United States Patent [19]

Maeda et al.

[11] Patent Number: 4,888,208

[45] Date of Patent: Dec. 19, 1989

[54] CERAMIC SUBSTRATE FOR PRINTED CIRCUITS AND PRODUCTION THEREOF

[75] Inventors: Satoshi Maeda; Ryu Yoneda; Kenichi Yokota; Hideo Miyake, all of Ootsu, Japan

[73] Assignee: Toyo Boseki Kabushiki Kaisha, Osaka, Japan

[21] Appl. No.: 103,456

[22] Filed: Oct. 1, 1987

[30] Foreign Application Priority Data

| Oct. 16, 1986 | [JP] | Japan | 61-246820 |
|---|---|---|---|
| Oct. 16, 1986 | [JP] | Japan | 61-246822 |
| Oct. 28, 1986 | [JP] | Japan | 61-257174 |
| Nov. 5, 1986 | [JP] | Japan | 61-264420 |

[51] Int. Cl.$^4$ ............................................. B05D 3/04
[52] U.S. Cl. ........................................ 427/96; 427/307; 427/309; 156/625; 156/667
[58] Field of Search ............... 427/96, 304, 307, 309; 156/653, 625, 663, 664, 667; 428/410

[56] References Cited

U.S. PATENT DOCUMENTS

| 1,782,169 | 11/1930 | Xamita | 428/410 |
|---|---|---|---|
| 3,551,228 | 12/1970 | Meth | 156/663 |
| 3,690,921 | 9/1972 | Elmore . | |
| 3,968,303 | 7/1976 | Harris | 428/332 |
| 3,970,591 | 7/1976 | Harris | 428/701 |
| 4,574,094 | 3/1986 | DeLuca et al. . | |
| 4,666,744 | 5/1987 | DeLuca et al. | 427/304 |
| 4,689,270 | 8/1987 | Deckelmann et al. | 428/701 |
| 4,715,117 | 12/1987 | Enomoto | 29/851 |
| 4,737,446 | 4/1988 | Cohen et al. | 430/311 |

FOREIGN PATENT DOCUMENTS

| 61-140195 | 6/1986 | Japan . |
|---|---|---|
| 61-151080 | 7/1986 | Japan . |
| 61-151081 | 7/1986 | Japan . |

Primary Examiner—Ellis P. Robinson
Assistant Examiner—P. J. Ryan
Attorney, Agent, or Firm—Wenderoth, Lind & Ponack

[57] ABSTRACT

There is provided a method of producing a ceramic substrate for printed circuits wherein at least the surface of the side to be circuit-printed is subjected to a roughening treatment with one of the following compounds:
(1) substances containing sulfur trioxide and
(2) substances which, upon decomposition, generate sulfur trioxide.

7 Claims, 3 Drawing Sheets

CERAMIC SUBSTRATE FOR PRINTED CIRCUITS AND PRODUCTION THEREOF

The present invention relates to a ceramic substrate for printed circuits, and more particularly to a ceramic substrate for printed circuits so formed that printed circuit patterns can firmly adhere to the ceramic substrate, and to a method of producing the same.

In a circuit-printed ceramic substrate, for example a ceramic substrate circuit-printed by wet plating, a method is proposed wherein, in order to obtain firm adhesion between printed circuit patterns fomed by wet plating and the ceramic substrate, the ceramic substrate is suitably surface-roughened beforehand, and then it is subjected to wet plating. For example, there may be mentioned a method wherein a ceramic substrate is immersed for a definite time in an aqueous solution of a hydroacid such as hydrofluoric acid, hydrochloric acid, sulfuric acid, etc., and surface roughening methods using a molten alkali-metal compound (Japanese Patent Kokai No. 16885/85, and U.S. Pat. No. 4,574,094).

In the surface roughening treatment by an aqueous solution of a hydroacid, except hydrofluoric acid, the degree of surface roughening is extremely small and sufficiently firm adhesion cannot be obtained. In the case of hydrofluoric acid, it is known that corrosion of metal films on the ceramic substrate takes place owing to a very small amount of fluorine ions remaining on the surface of the ceramic substrate [J. Electrochem. Soc. Vol. 120, p. 1518 (1973)].

In the surface roughening treatment with alkali-metal compounds, there have been exemplified hydroxides, carbonates, nitrates, and mixtures of these, but only hydroxides can give sufficient surface roughening and firm adhesion. When using an alkali-metal hydroxide, although surface roughening can be obtained which will give firm adhesion, there takes place embrittlement of the ceramic substrate itself, and moreover since the surface roughening is accompanied by minute and deep corrosion, the removal of the catalyst remaining in the printe circuit patterns on the roughened surface becomes very difficult. Giving of a catalyst to the ceramic substrate is indispensable for depositing electroless plating on the ceramic substrate which is an insulator. However, the catalyst remaining in the minute and deep corroded parts lowers the surface resistivity of the ceramic substrate to remarkably hinder the electric insulation between the printed circuit patterns. In order to remove the catalyst sufficiently between the printed circuit patterns formed by wet plating on the ceramic substrate surface-roughened with an alkali-metal hydroxide, it is necessary to immerse the ceramic substrate in a chemically highly active reagent for a long time in the catalyst removing step which is the final stage of the formation of the printed circuit patterns in wet plating. Therefore the printed circuit patterns are subjected to excessive etching during this time. This results in an extreme decrease in the image resolving power of the patterns. Beside this, the surface roughening of the ceramic substrate with an alkali-metal hydroxide suffers from various other problems. It has been very difficult heretofore to obtain a ceramic substrate for printed circuits by wet plating, which has firm adhesion between the printed circuit patterns and the ceramic substrate, has no excessive damage on the substrate, and is easy in the removal of the catalyst given.

We have conducted intensive researches to solve the above-mentioned problems of the prior art, and as a result, we have found that the problems can be solved by subjecting the ceramic substrate to surface roughening treatment with a specific treating agent.

Thus the present invention provides a ceramic substrate for printed circuits characterized in that, in the ceramic substrate for printed circuits, the side to be circuit-printed of the ceramic substrate is surface-roughened in such a manner that the protruding parts are formed by long and narrow ridges and the hollow parts are of indefinite form, or else there is no minute unevenness on the particle surface of the outer layer and the gap area between the surface layer particle is 10–50% based on the total of the gap area and the area except the gap area. The present invention also provides a method of producing a ceramic substrate for printed circuits characterized in that at least the surface of the side to be circuit-printed is subjected to roughening treatment with one or more kinds of the following compounds:

(1) $(H_xP_yO_z)_n$ wherein H is hydrogen, P phosphorus, and O oxygen, and $0 \leq x \leq 4$, $1 \leq y \leq 4$, $1 \leq z \leq 10$, $1 \leq n \leq 4$;
(2) sulfur trioxide;
(3) substances containing sulfur trioxide;
(4) substances which, upon decomposition, form sulfur trioxide.

BRIEF DESCRIPTION OF THE DRAWINGS

FIG. 4 is the electron-microscopic photograph of the roughened ceramic surface according to Comparative Example 1, while FIG. 5 is that of the ceramic surface not treated.

Figure 1:
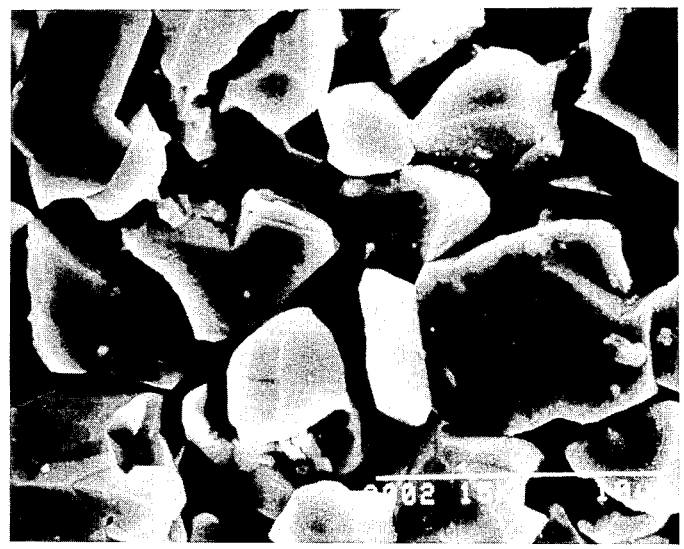
FIGS. 1, 2 and 3 are electron microscopic photographs of the roughened ceramic surfaces obtained in Examples 4, 1 and 2 respectively.
Figure 2:
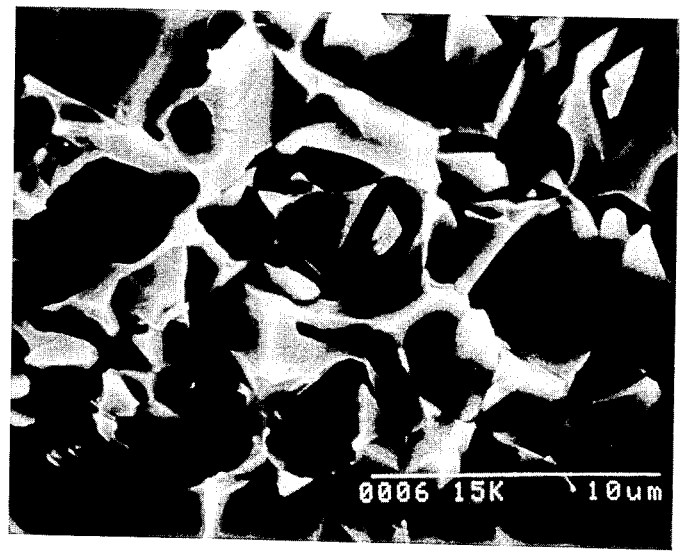
Figure 3:
Figure 4:
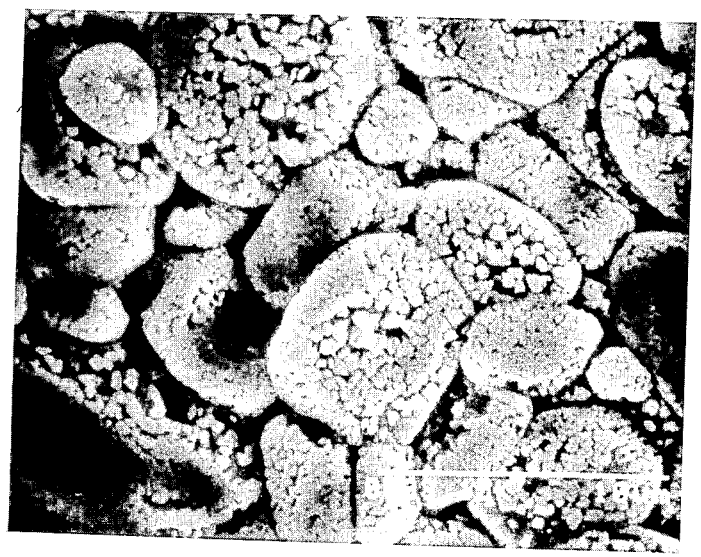
FIGS. 4 and 5 are those of prior art. More particularly
Figure 5:
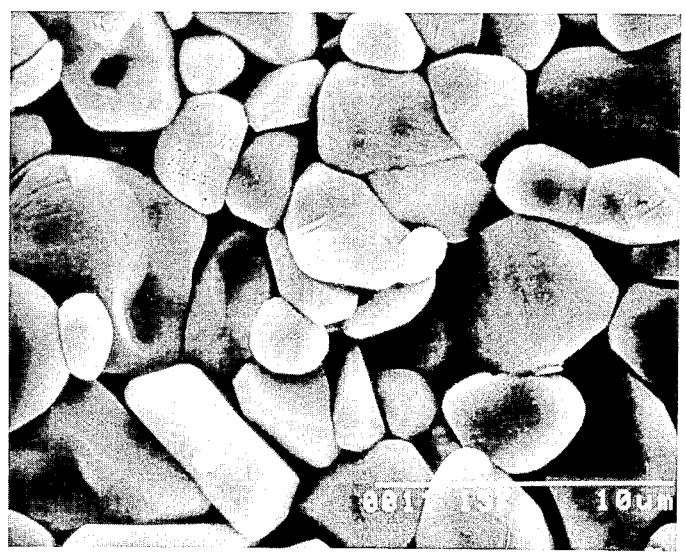

The present invention will be further explained as follows by referring partly to the accompanying drawings wherein:

FIGS. 1, 2, and 3 show surface-roughened ceramic substrates of the present invention. FIG. 4 shows a ceramic substrate of the conventional technique surface-roughened by an alkali-metal hydroxide, and FIG. 5 shows a non-treated ceramic substrate. Each is a photograph of 5000 times magnification taken by a scanning electron microscope.

As seen from FIGS. 1–3, the ceramic substrate surface-roughened according to the present invention shows an aspect such that the protruding parts are long and narrow, the ratio of the longer side to the shorter side is more than 3 or further, more than 5, and they are like ridges of a mountain range, while the hollow parts are of indefinite form like slopes or valleys of a mountain range extending beneath the ridges. Or else, on the outer layer surface of the outer layer particles, there is no substantial hollow parts resulting from surface-roughening corrosion, etc. and further on the border between the outer layer particles, there are a great detal of gaps between particles, thus being far from a densely packed state. As used herein the gap means such a region at which an outer layer particle and adjacent another outer layer particle are at a distance more than $0.2\mu$ from each other, on a surface of a depth up to $\frac{1}{2}$ R at most, from the apices of the outer layer particles toward the inside wherein R shows the average diameter of the particles forming the substrate.

The ceramic substrate according to the present invention is so surface roughened that, in the resulting state of the surface layer particles, the gap area is 10–50%, favorably 12–50%, and more favorably 15–50%, based on the total of the gap area and the area except the gap area.

Depending on their kinds, ceramic substrates are different in purity, size of constituent particles, distribution of the size of the constituent particles, size and distribution of the crystals forming the constituent particles. But in the present invention, the size or area of the hollow parts seems to depend on the size of the constituent particles and not on the size of the crystals, while in the surface roughening by an alkali-metal hydroxide according to the prior art, hollow parts of a minute width are formed; this means that the size of the hollow parts depends strongly on the size of the crystals and not on the size of the constituent particles.

The aspect of surface-roughened ceramic substrates by alkali hydroxide according to conventional techniques (a typical example is shown in FIG. 4) is such that the protruding parts form circular, square or polygonal-like pillar heads, and the hollow parts are the gaps between the protruding parts; and the hollow parts have narrow areas at their opening parts. Furthermore, in the surface-roughened ceramic substrate of the present invention, the opening parts of the hollow parts have a width substantially more than $0.3\mu$ or more than $0.5\mu$, and almost no opening parts having a width less than $0.3\mu$ or $0.1\mu$ are not seen. In addition, the degree of surface roughness of the surface-roughened ceramic substrate according to the present invention is $0.5$–$3.5$ $\mu Ra$, preferably $1.2$–$2.8$ $\mu Ra$.

As examples of the methods of surface roughening of the ceramic substrates in the present invention, the following treating methods may be mentioned:

(a) A method wherein a gas of sulfur trioxide in the temperature range of 0°–200° C., preferably 100°–200° C. (preferably at a gas concentration more than 50 vol %) is sprayed against the ceramic substrate or the substrate is placed in this gas;

(b) A method wherein the ceramic substrate is immersed in fuming sulfuric acid in the temperature range of 0°–100° C., preferably 25°–100° C. containing sulfur trioxide, preferably for 10 minutes to 5 hours.

(c) A method wherein the ceramic substrate is immersed in sulfuric acid in the temperature range of 290°–315° C. which is forming sulfur trioxide by decomposition, or after it is immersed in sulfuric acid of room temperature, it is heated to above 290° C. In both cases, it is treated preferably for 5 minutes to 5 hours.

(d) A method wherein the ceramic substrate is immersed preferably for 1 minute to 5 hours in a molten salt selected from ammmonium bisulfate or a metal bisulfate which, upon decomposition, forms sulfur trioxide, or a mixture of two or more kinds of these. As used herein the metal bisulfate refers to the bisulfate of a metal such as sodium, potassium, magnesium, calcium, barium, silver, iron, etc.

(e) A method wherein the ceramic substrate is immersed in an aqueous solution (the concentration being from 10 weight % to saturation) of a metal bisulfate which, upon decomposition, forms sulfur trioxide, or a mixture of two or more kinds of such metal bisulfates, and thereafter it is heated to remove water and further heated at a temperature sufficient for melting. The condition is the same as in the above-mentioned (d).

(f) A method wherein an anhydride or hydrate of a metal salt of sulfuric acid which, upon decomposition, forms sulfur trioxide, or a mixture of two or more kinds of such anhydrides or hydrates is caused to adhere to the ceramic substrate and it is then heated. The metal salt of sulfuric acid as referred to herein is a salt of a divalent metal, the representatives of which are zinc, nickel, and magnesium, and the most favorable hydrate is heptahydrate.

(g) A method of surface roughening treatment of the ceramic substrate wherein the ceramic substrate is treated with a compound represented by the formula:

$$(H_xP_yO_z)_n \quad (1)$$

wherein $0 \leq x \leq 4$, $1 \leq y \leq 4$, $1 \leq z \leq 10$, and $1 \leq n \leq 4$, which is in a molten state, or a mixture of two or more kinds of such molten compounds.

(g)-1 A method wherein the ceramic substrate is immersed for 5 minutes to one hour in a melt of a compound represented by the general formula (1) or a mixture of two or more kinds of such compounds, in the temperature range of 26.5°–1000° C., preferably 200°–600° C., more favorably 250°–400° C.

(g)-2 A method wherein the ceramic substrate is immersed in an aqueous solution (concentration being from 5 weight % to saturation) of a compound represented by the general formula (1) or a mixture of two or more kinds of such compounds, for 5 to 30 minutes, is taken out and heated to remove water, and thereafter further heated for 5 minutes to one hour in the temperature range of 100°–1000° C. favorably 200°–600° C., more favorably 250°–400° C.

(g)-3 A method wherein the ceramic substrate is applied with a compound repesented by the general formula (1) or a mixture of two or more kinds of such compounds, in powder form of paste form, and thereafter it is heated for 5–60 minutes in the temperature range of 26.5°–1000° C., favorably 200°–600° C., more favorably 250°–400° C.

In all of the above-mentioned methods, it is favorable that the quantity of the compound to be caused to adhere to the ceramic substrate is 10–1000 mg/cm$^2$.

The compositions represented by the general formula (1) used for the surface roughening treatment of the ceramic substrate in the present invention include phosphinic acid, phosphonic acid, phosphoric acid, diphosphonic acid, hyphophosphoric acid, diphosphoric acid, metaphosphrous acid, linear polyphosphoric acid, cyclic metaphosphoric acid, infinite chain metaphosphoric acid, etc. and favorable compounds are phosphoric acid, diphosphoric acid, cyclic metaphosphoric acid, and infinite chain metaphosphoric acid. In the surface roughening treatment of the ceramic substrate in the present invention, one or more kinds of these compounds are used in a molten state.

The composition of the ceramic substrate in the present invention does not matter whether it is an oxide system or non-oxide system. Representative examples are alumina, silicates, beryllia, titania, zirconia, magnesia, calcia, silicon carbide, aluminum nitride, silicon nitride, boron nitride and mixtures of these compounds. Favorable compositions are those composed mainly of alumina, and those composed mainly of aluminum nitride, and more favorable compositions are those composed mainly of alumina.

The wet platings in the present invention include all kinds of well-known electroless platings including electroless plating of metals such as copper, nickel, cobalt, tin, lead, silver, gold, platinum, etc. and electroless or electroplating of the same or another metal deposited on these electroless plating films which form the lowest layers, and disperse platings containing organic or inorganic dispersed particles.

The surface-roughened ceramic substrate of the present invention is applied also as a ceramic substrate for thick film printed circuits.

As examples of the circuit pattern formation methods in the present invention, the following may be mentioned:

(i) Subtractive method 1: This method comprises depositing wet plating on the whole surface of the ceramic substate, forming a resist film on the wet plating film, dissolving and removing by etching, the part except the part covered with the resist film, stripping the resist film, and then removing the catalyst between the printed circuit patterns.

(ii) Subtractive method 2: This method comprises depositing wet plating on the whole surface of the ceramic subsrate, forming a resist film on the wet plating film, dissolving and removing by etching, the part except the part covered with the resist film, removing the catalyst between the printed circuit patterns and then stripping the resist film.

(iii) Semi-additive method: This method comprises depositing thin plating on the whole surface of the ceramic substrate, forming a resist film on the wet plating film, further depositing electroplating on the part except the part covered with the resist film so as to obtain a necessary and sufficient thick film, then stripping the resist film, dissolving to remove the thin wet plating film covered with the resist film, and thereafter removing the catalyst between the printed circuit pattern.

(iv) Full additive method 1: This method comprises putting a catalyst in the form of the printed circuit patterns on the ceramic substrate, and then depositing wet plating only on the catalyst.

(v) Full additive method 2: This method comprises putting a catalyst on the whole surface of the ceramic substrate, activating the catalyst of only the part of the printed circuit patterns, depositing wet plating to only the activated part, and then removing the catalyst between the printed circuit patterns.

(vi) Full additive method 3: This method comprises forming a permanent resist film on a ceramic substrate which is given a catalyst on the whole surface, and depositing wet plating to the part except the part covered with the resist film.

(vii) Full additive method 4: This method comprises forming a resist film on a ceramic substrate given a catalyst on the whole surface, depositing wet plating to the part except the part covered with the resist film, then stripping the resist film, and removing the catalyst between the printed circuit patterns.

These methods are well known per se in the art of formation of circuit patterns on ceramic substrates and any of these methods may be used.

In the following the present invention will be explained in detail by way of Examples, but it is to be understood that the invention is not limited by these Examples.

EXAMPLE 1

A white ceramic substrate, containing 96% alumina, 50.8 mm in length, 50.8 mm in width, and 0.65 mm in thickness, was immersed for 10 minutes in molten salt of sodium bisulfate at 425° C., and after cooling, it was rinsed with water sufficiently. To this treated substrate, a palladium catalyst was given, using a catalyze agent HS 101 B (produced by Hitachi Chemical Industries, Ltd.) After promoting with an accelerator ADP 201 (produced by Hitachi Chemical Industries, Ltd.), the ceramic substrate was immersed in a copper plating solution CUST 201 (produced by Hitachi Chemical Industries, Ltd.), for one hour at room temperature, so as to deposit electroless copper plating, 0.6 $\mu$m in thickness, on the whole surface of the ceramic substrate. Then, round resist film, 2 mm in diameter, was formed by the dry film process, and on the exposed electroless copper plating film, copper eletroplating, 15 $\mu$m in thickness, was deposited, using an acid copper sulfate plating bath. After stripping the resist film, the part of the electroless copper plating covered with the resist film was etched with an etching solution composed of sulfuric acid and hydrogen peroxide (14 weight % sulfuric acid, 4 weight % hydrogen peroxide) to obtain round pads, 2 mm in diameter. The ceramic substrate was further immersed in a 10 weight % aqueous cupric chloride solution to remove the catalyst remaining on the surface. Then a tin-plated copper wire, 0.8 mm in diameter, was soldered with a eutectic solder on the round pads, and was pulled to the direction perpendicular to the ceramic substrate, thus to measure the adhesion strength. The embrittlement of the ceramic substrate was judged by the probability of the breakage of the ceramic substrate upon pulling off the round pads in the above-mentioned test. The degree of the ease of catalyst removal was judged from the surface color of the ceramic substrate after the ceramic substrate was immersed for 10 seconds in an aqueous 10 weight % cupric chloride solution and the immersion time necessary for the surface color of the ceramic substrate to become its original clear white color. Table 1 shows the adhesion strength, probability of the breakage of the ceramic substrate (embrittlement), surface color of the ceramic substrate after immersion for 10 seconds in an aqueous cupric chloride solution, and the immersion time necessary for the surface color of the ceramic substrate to become its original clear white color.

EXAMPLE 2

After applying powder of a hydrate of zinc sulfate on the whole surface of the above-mentioned white ceramic substrate containing 96% alumina, the substrate was heated at 800° C. for 10 minutes. After cooling to room temperature, it was rinsed with water sufficiently. According to the same method as in EXAMPLE 1, round pads of a diameter of 2 mm were formed on this treated substrate. Then measurement was made for the adhesion strength between the ceramic substrate and the plated film, the probability of the breakage of the ceramic substrate upon pulling off the round pads, the surface color of the ceramic substrate after the ceramic substrate was immersed in an aqueous 10 weight % cupric chloride solution for 10 seconds, and the immersion time necessary for the surface color of the ceramic substrate to become its original clear white color. Table 1 shows the adhesion strenth, the probability of the breakage of the ceramic substrate (embrittlement), the surface color of the ceramic substrate after immersion in the aqueous cupric chloride solution for 10 seconds, and the immersion time necessary for the ceramic substrate to become its original clear white color.

COMPARATIVE EXAMPLE 1

After immersing the above-mentioned white ceramic substrate containing 96% alumina in an aqueous 50 weight % sodium hydroxide, at room temperature for 10 minutes, it was heated at 150° C. for 10 minutes thereby to remove water. Thereafter it was further heated at 450° C. for 15 minutes. After cooling to room temperature, it was neutralized with 10 weight % sulfuric acid. Subsequently, according to the same method as in EXAMPLE 1, round pads, 2 mm in diameter, were formed on this treated substrate. Measurement was made for the adhesion strength between the ceramic substrate and the plated film, the probability of the breakage of the ceramic substrate upon pulling off the pads, the surface color of the ceramic substrate after immersing the ceramic substrate in an aqueous 10 weight % cupric chloride solution for 10 seconds, and the immersion time necessary for the surface color of the ceramic substrate to become its original clear while color. Table 1 shows the adhesion strength, the probability of the breakage of the ceramic substrate (embrittlement), the surface color of the ceramic substrate after immersion for 10 seconds in the aqueous cupric chloride, and the immersion time necessary for the ceramic substrate to become its original clear while color. At the time point at which the surface color of the ceramic substrate became its original clear white color, most of the round pads on the ceramic substrate dissolved, and round pads retaining the original shape were only 15% of the whole.

COMPARATIVE EXAMPLE 2

The above-mentioned white ceramic substrate containing 96% alumina was immersed in 55% hydrofluoric acid at room temperature for 40 minutes, and then it was sufficiently rinsed with water. In the same way as in EXAMPLE 1, round pads of a diameter of 2 mm were formed on this treated substrate. Measurement was made for the adhesion strength between the ceramic substrate and the plated fiml, the probability of the breakage of the ceramic substrate upon pulling off the pads, the suface color of the ceramic substrate after immersing the ceramic substrate in an aqueous 10 weight % cupric chloride solution for 10 seconds, and the immersion time necessary for the surface color of the ceramic substrate to become its original clear white color. Table 1 shows the adhesion strength, the probability of the breakage of the ceramic substrate (embrittlement), the surface color of the ceramic substrate after immersion in the aqueous cupric chloride solution for 10 seconds, and the immersion time necessary for the surface color of the ceramic substrate to become its original clear white color. At the time point at which the surface color of the ceramic substrate became its original clear white color, 85% of the round pads on the ceramic substrate retained their original shape. But the diameter of the round pads became smaller by about 30 μm due to excessive etching.

TABLE 1

Adhesion strength, probability of breakage, ease of catalyst removal

| Measured values | Treatment methods | | | |
|---|---|---|---|---|
| | Sodium bisulfate | Zinc sulfate heptahydrate | Sodium hydroxide | Hydrofluoric acid |
| Adhesion strength (*1) (kg mm$^{-2}$) | 2.3 | 2.3 | 2.1 | 1.2 |
| Probability of substrate breakage (%) (*1) | 10 | 10 | 60 | 0 |
| Surface color of ceramic substrate after immersion in 10% CuCl$_2$ for 10 seconds | Clear white color | Clear white color | Dark gray color | Gray color |
| Time of immersion (sec.) in 10% CuCl$_2$ necessary for the surface color of the substrate to become clear white | ≦10 | ≦10 | ≧120 | ≧60 |

(*1) Adhesion strength and probability of substrate breakage are shown by the average measured values of 20 substrates.

EXAMPLE 3

After applying powder of cyclic polymetaphosphoric acid on a white ceramic substrate containing 96% alumina, 50.8 mm×50.8 mm and 0.65 mm thick, the substrate was heated at 300° C. to melt the cyclic polymetaphosphoric acid on the substrate, and it was kept at 300° C. for 10 minutes. Then it was cooled to room temperature and was rinsed with water sufficiently. To this treated substrate, a palladium catalyst was given using a catalyze agent HS 101 B (produced by Hitachi Chemical Industries, Ltd.). After promoting with an accelerator agent ADP 201 (produced by Hitachi Chemical Industries Ltd.), the ceramic substrate was immersed in an electroless copper plating liquid CUST 201 (produced by Hitachi Chemical Industries, Ltd.) at room temperature for one hour to deposit electroless copper plating, 0.6 μm thick, on the whole surface of the ceramic substrate. Then, circular resist film, 2 mm in diameter, was formed by the dry film process, and on the exposed electroless copper plating film, a copper electroplating film, 15 μm thick, was deposited, using an acid copper sulfate plating bath. After stripping the resist film, the part of the electroless copper plating covered with the resist film was etched with a sulfuric acid-hydrogen peroxide etching liquid (14 weight % sulfuric acid, 5 weight % hydrogen peroxide) to obtain round pads of a 2 mm diameter. Further, the ceramic substrate was immersed in an aqueous 10 weight % cupric chloride solution to remove the catalyst remaining on the surface. Then, tin plated copper wire (0.8 mm in diameter) was soldered on the round pads with eutectic solder. Adhesion strength was measured by pulling the tin-plated wire to the direction perpendicular to the ceramic substrate. The embrittlement of the ceramic substrate was judged by the probability of the breakage of the ceramic substrate upon pulling off the round pads in the above-mentioned test. The ease of the removal of the catalyst was judged by the surface color of the ceramic substrate after immersion of the ceramic substrate in an aqueous 10 weight % cupric chloride solution for 10 seconds and by the immersion time necessary for the surface color of the ceramic substrate to become its original clear white color. Table 2 shows the adhesion strength, probability of the breakage of the ceramic substrate (embrittlement), the surface color of the ceramic substrate after immersion in the aqueous cupric chloride solution for 10 seconds, and the immersion time necessary for the suface color of the ceramic substrate to become its original clear white color.

EXAMPLE 4

The above-mentioned white ceramic substrate containing 96% alumina was immersed in phosphoric acid in a molten state at 350° C. for 10 minutes. Thereafter, it was cooled to room temperature and was rinsed with water sufficiently. In the same way as in EXAMPLE 3, round pads, 2 mm in diameter, were formed on this treated substrate. Meaurement was made for the adhesion strength between the ceramic substrate and the plating film, the probability of the breakage of the ceramic substrate upon pulling off the round pads, the surface color of the ceramic substrate after immersion in an aqueous 10 weight % cupric chloride solution for 10 seconds, and the immersion time necessary for the surface color of the ceramic substrate to become its original clear white color. Table 2 shows the adhesion strength, probability of the breakage of the substrate, surface color of the substrate after immerion in the aqueous cupric chloride solution for 10 seconds, and immersion time necessary for the surface color of the substrate to become its original clear white color.

COMPARATIVE EXAMPLE 3

After immersing the above-mentioned white ceramic substrate containing 96% alumina in an aqueous 50 weight % sodium hydroxide solution at room temperature for 10 minutes, water was removed by heating at 150° C. for 10 minutes. Thereafter, the substrate was heat-treated at 450° C. for 15 minutes. After cooling to room temperature, it was neutralized with 10 weight % sulfuric acid. In the same way as in EXAMPLE 3, round pads, 2 mm in diameter, were formed on this treated substrate. Measurement was made for the adhesion strength between the ceramic substrate and the plating film, the probability of the breakage of the ceramic substrate upon pulling of the round pads, the surface color of the ceramic substrate after immersion in an aqueous 10 weight % cupric chloride solution for 10 seconds, and the immersion time necessary for the surface color of the ceramic substrate to become its original clear white color. Table 2 shows the adhesion strength, the probability of the breakage of the ceramic substrate (embrittlement), the surface color of the ceramic substrate after immersion in the aqueous cupric chloride solution for 10 seconds, and the immersion time necessary for the surface color of the ceramic substrate to become its original clear white color. At the time point at which the surface color of the ceramic substrate became its original clear white color, most of the round pads on the ceramic substrate dissolved, and round pads retaining their original shape were only 15% of the whole.

COMPARATIVE EXAMPLE 4

After immersing the above-mentioned white ceramic substrate containing 96% alumina in 55% hydrofluoric acid at room temperature for 40 minutes, it was rinsed with water sufficiently. Then, in the same way as in EXAMPLE 3, round pads, 2 mm in diameter, were formed. Measurement was made for the adhesion strength between the ceramic substrate and the plating film, the probability of the breakage of the ceramic substrate upon pulling off the round pads, the surface color of the ceramic substrate after immersion of the substrate in an aqueous 10 weight % cupric chloride solution for 10 seconds, and the immersion time necessary for the surface color of the ceramic subsrate to become its original clear white color. Table 2 shows the adhesion strength, the probability of the breakage of the ceramic substrate (embrittlement), the surface color of the ceramic substrate after immersion in the aqueous cupric chloride solution for 10 seconds, and the immersion time necessary for the surface color of the ceramic substrate to become its original clear white color. At the time point at which the surface color of the ceramic substrate became its original clear white color, 85% of the round pads on the ceramic substrate retained their original shape. But the diameter of the round pads became by about 30 $\mu$m smaller owing to excessive etching.

TABLE 2

Adhesion strength, probability of breakage, and ease of catalyst removal

| Measured values | Treatment methods | | | |
| --- | --- | --- | --- | --- |
| | Cyclic metaphosphoric acid | Phosphoric acid | Sodium hydroxide | Hydrofluoric acid |
| Adhesion strength (*1) (kgmm$^{-2}$) | 2.4 | 2.3 | 2.1 | 1.2 |
| Probability of substrate breakage (%) (*1) | 30 | 10 | 60 | 0 |
| Surface color of ceramic substrate after immersion in 10% CuCl$_2$ for 10 seconds | Clear white color | Clear white color | Dark gray color | Gray color |
| Time of immersion (sec) in 10% CuCl$_2$ necessary for the surface color of the substrate to become clear white | $\leq 10$ | $\leq 10$ | $\geq 120$ | $\geq 60$ |

(*1) Adhesion strength and probability of substrate breakage are shown by the average measurement values of 20 substrates.

The ceramic substrate for printed circuits of the present invention has strong adhesion strength between the ceramic substrate and printed circuit patterns, and since the ceramic substrate is not subjected to embrittlement, the strength of the ceramic substrate itself is not lowered. Moreover, the substrate has a high electric insulation and a high image resolving power between the printed circuit patterns. These are great advantages of the ceramic substrate of the present invention.

The ceramic substrate metallized on the surface by the method of the present invention can be applied for various kinds of uses such as parts of machines, electric and electronic parts, etc. in which characteristic properties of metals are given to ceramic substrates.

What we claim is:

1. A method of producing ceramic printed circuits wherein at least the surface to be circuit-printed of a ceramic substrate made by sintering is subjected to a roughening treatment with one of the following materials:
   (1) substances containing sulfur trioxide, and
   (2) substances which, upon decomposition, generate sulfur trioxide, and subsequently printing said circuits by wet plating on the roughened surface.

2. The method as claimed in claim 1 wherein the ceramic substrate is immersed in fuming sulfuric acid of the temperature range of from 0° C. to 100° C. containing sulfur trioxide, for 10 minutes to 5 hours.

3. The method as claimed in claim 1 wherein the ceramic substrate is immersed in sulfuric acid which is generating sulfur trioxide by decomposition, in the temperature range of from 290° C. to 315° C. or the ceramic substrate is immersed in sulfuric acid of room temperature and thereafter it is heated to a temperature above 290° C., for 5 minutes to 5 hours.

4. The method as claimed in claim 1 wherein the ceramic substrate is immersed in molten ammonium bisulfate or a metal bisulfate, which, upon decomposition, forms sulfur trioxide for 1 minute to 5 hours, the metal bisulfate being that of sodium, potassium, magnesium, calcium, barium, silver or iron.

5. The method as claimed in claim 1 wherein the ceramic substrate is immersed in an aqueous solution of a metal bisulfate which, upon decomposition, forms sulfur trioxide, and after the substrate is heated to remove water, it is further heated at a temperature sufficient for melting the bisulfate for 1 minute to 5 hours, the metal bisulfate being that of sodium, potassium, magnesium, calcium, barium, silver or iron.

6. The method as claimed in claim 1 wherein an anhydride or a hydrate of a metal sulfate which, upon decomposition, forms sulfur trioxide, is applied to the surface of a ceramic substrate, and then it is heated, the sulfate being that of zinc, nickel or magnesium.

7. The method as claimed in claim 8 wherein the hydrate is heptahydrate.

* * * * *